United States Patent [19]
Wilmsmeyer

[11] Patent Number: 5,387,535
[45] Date of Patent: Feb. 7, 1995

[54] METHOD OF FABRICATING SEMICONDUCTOR DEVICES IN CMOS TECHNOLOGY WITH LOCAL INTERCONNECTS

[75] Inventor: Klaus Wilmsmeyer, Denzlingen, Germany

[73] Assignee: Deutsche ITT Industries GmbH, Freiburg, Germany

[21] Appl. No.: 196,060

[22] Filed: Feb. 14, 1994

[30] Foreign Application Priority Data

Jun. 15, 1992 [DE] Germany .............................. 4219529

[51] Int. Cl.6 ........................................... H01L 21/72
[52] U.S. Cl. ..................................... 437/57; 437/200; 437/247
[58] Field of Search ...................... 437/56, 57, 58, 192, 437/196, 200, 247; 148/DIG. 147

[56] References Cited

U.S. PATENT DOCUMENTS

| | | | |
|---|---|---|---|
| 4,873,204 | 10/1989 | Wong et al. | 437/200 |
| 4,876,213 | 10/1989 | Pfiester | 437/57 |
| 5,010,032 | 4/1991 | Tong et al. | 437/57 |
| 5,023,201 | 6/1991 | Stanasolovich et al. | 437/200 |

FOREIGN PATENT DOCUMENTS 0499855  8/1992  European Pat. Off. .

OTHER PUBLICATIONS

ESSDERC '89; Berlin, Germany; pp. 903–906; Characterization of Submicron Titanium Silicon Local Interconnect Technology; Phillips Research Labs.

Primary Examiner—Brian E. Hearn
Assistant Examiner—Chandra Chaudhari
Attorney, Agent, or Firm—Thomas L. Peterson

[57] ABSTRACT

A method of fabricating CMOS devices with local interconnects is disclosed which is performed in two stages. In the first stage, a SALICIDE process is carried out, and in the second stage, the local interconnects are formed.

10 Claims, 3 Drawing Sheets

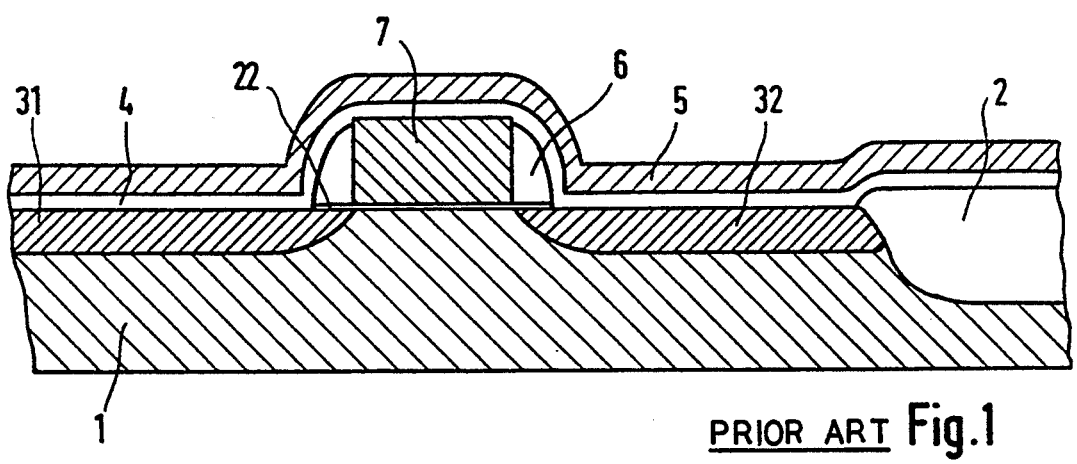
PRIOR ART Fig.1
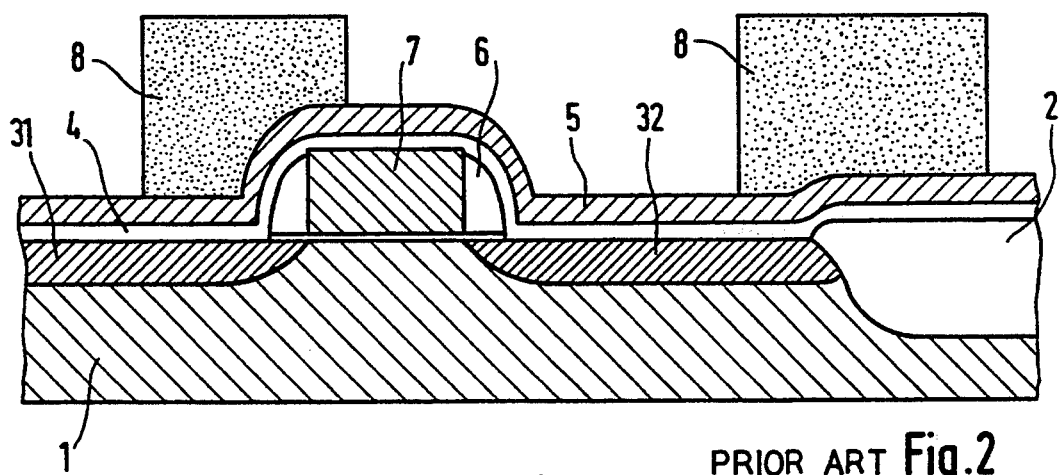
PRIOR ART Fig.2
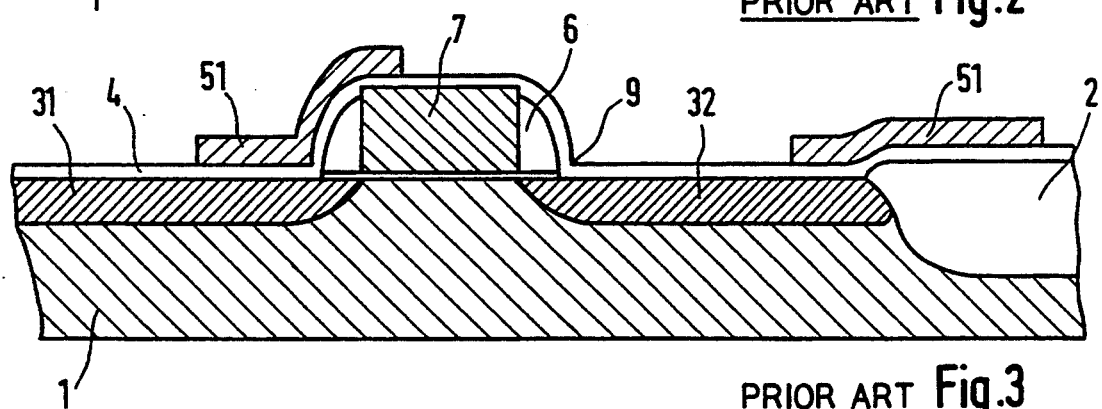
PRIOR ART Fig.3
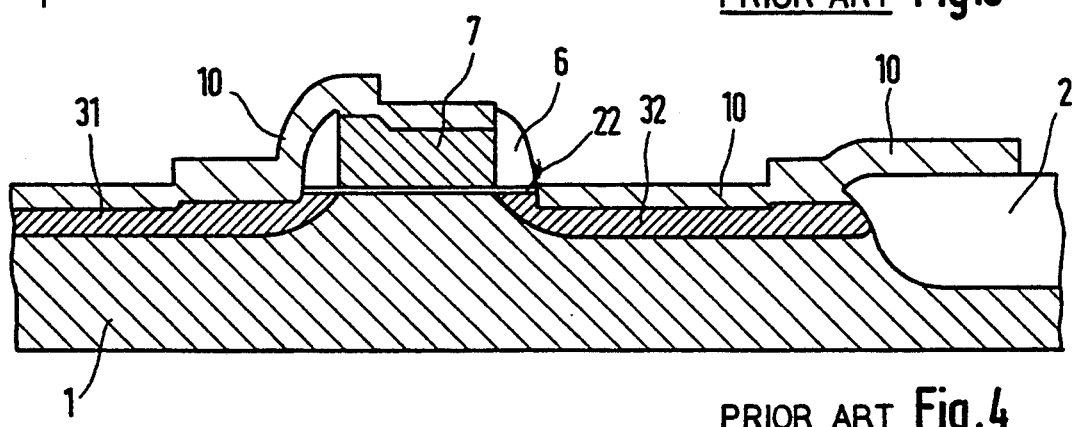
PRIOR ART Fig.4

METHOD OF FABRICATING SEMICONDUCTOR DEVICES IN CMOS TECHNOLOGY WITH LOCAL INTERCONNECTS

CROSS-REFERENCE TO RELATED APPLICATIONS

This application is a continuation-in-part of PCT Application PCT/EP93/01452 designating the United States.

TECHNICAL FIELD

The present invention relates to a method of fabricating CMOS devices with local interconnects.

BACKGROUND OF THE INVENTION

In advanced CMOS technology, so-called local interconnects are used to increase packing density. Such a scheme involves the definition of defined conducting paths of, e.g., polysilicides, after source/drain implantation has occurred and before the deposition of an intermediate-oxide layer. It provides a means of creating buried contacts which permit a direct connection between the polysilicon layer and the active regions without a metal interconnection.

The conventional process for forming local interconnects (hereinafter referred to as "LIs") begins with standard CMOS fabrication steps. After source/drain implantation has taken place, thin layers of a heat-resistant metal, such as titanium, and alpha silicon are sputtered in the form of a double layer. The alpha silicon is then patterned by means of a photolithographic process and annealed in a nitrogen atmosphere, so that silicide will form where silicon and metal are in contact. Selective etching then removes the unconverted metal and, in the case of titanium, any titanium nitride that may have formed, and the wafer is subjected to a second annealing process in order to convert the original C49 silicide to the lower-resistivity C54 silicide. After that, the standard CMOS process is continued with silox BPSG deposition.

In these methods, aside from the formation of the LIs in a self-aligning process, source, drain, and gate regions are silicidized and, thus, made less resistive (SALICIDE process).

Particularly for small structures, the conventional method has a number of disadvantages:

The above-mentioned patterning must be performed using an anisotropic etching technique (RIE) so as to avoid underetching. This involves the risk of so-called filaments of alpha silicon being left in the gate corners, which in the further course of the process may cause short circuits by the formation of metal-silicide straps. If this is to be avoided, extreme overetching is necessary, which, in turn, has the disadvantage of removing part of the metal, so that outside the LI regions, the metal will be considerably thinner than in those regions where the local interconnects are formed. This means, however, that during the subsequent salicide formation, a) too little silicide will form on the first-mentioned regions, which thus become highly resistive, and b) too much silicide will form on the LI regions, involving the risk of interconnection failures with reverse currents. See M. G. Pitt et al., "Electrical Characterization of Submicron Titanium Silicon Local Interconnect Technology", ESSDERC 89, p. 903 et seq., where the above-mentioned problems are described in connection with the titanium-silicide formation.

The effectiveness of the removal of the alpha silicon from the gate corners by overetching depends essentially on the shape of the spacers which isolate the edges of the polysilicon gate proper. The shape of the spacers, and here particularly their side steepness, however, is subject to general process variations, so that the reliability of the filament removal is not ensured.

In addition, the silicide formation in the first annealing step is a sensitive process for the non-LI regions since it is determined by two competing reactions. If the heat-resistant metal is titanium, titanium nitride will form from the surface, and titanium silicide will form from the titanium/silicon interface. For this reason, process steps which may unintentionally affect the surface of the reactive titanium, such as the above-mentioned etching and photoresist-stripping steps in the course of the photolithographic process, are undesirable. There is the danger of the nitride formation as well as the silicide formation becoming unrepeatable due to contamination, which also includes oxidation.

It is, therefore, the object of the invention to modify the above method in such a way that it does not nave the disadvantages described. This object is attained by the invention as claimed and as described herein.

BRIEF DESCRIPTION OF THE DRAWINGS

The invention will now be explained in more detail with reference to the accompanying drawings, which show one embodiment of the invention. In the individual figures, the individual process seeps are summarized in cross-sectional views, with like parts being designated by like reference characters. In the drawings:

FIG. 1 to FIG. 4 show the conventional steps of the LI technology;

DETAILED DESCRIPTION OF THE PREFERRED EMBODIMENTS

Figure 5:
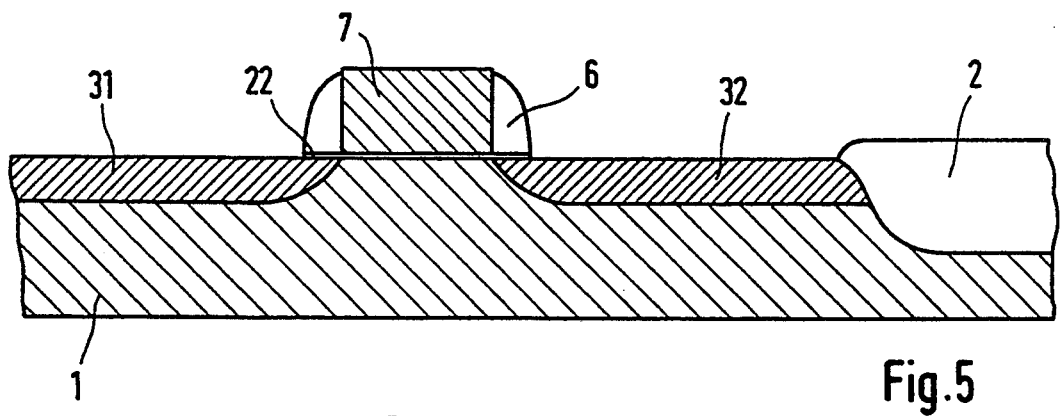
FIGS. 5 to 8 show the steps within the scope of the invention for forming the SALICIDE portion.

In conventional LI technology, first the usual CMOS process is carried out until after the p+ diffusion (FIG. 1). The resulting structure shows the substrate 1 with the source/drain regions 31, 32, the field-oxide region 2, the gate oxide 22, the polysilicon layer 7, and the spacers 6. This structure is then covered by a sputtered double layer of titanium 4 and amorphous alpha silicon 5.

In a photolithographic process, the photoresist pattern 8 is then formed to define the regions of the desired local interconnects (FIG. 2). The exposed silicon layer 5 is removed down to the titanium layer 4 by anisotropic etching (RIE), and the etch mask (photoresist layer 8) is removed (FIG. 3).

By annealing in a nitrogen atmosphere, a layer 10 of titanium silicide is formed where the titanium layer 4 is in contact with silicon. The titanium nitride, formed by a competing reaction, and excess titanium are removed by selective etching, and in a second annealing step, the silicide of C49 configuration is converted to the lower-resistivity silicide of the C54 crystal structure (FIG. 4). After that, the standard CMOS process is continued with silox boron phosphorus silicate glass deposition.

In the method according to the invention, which is illustrated by FIGS. 5 to 11, the process steps are separated into the silicide formation and the formation of the local interconnects. Starting with an n-type substrate 1, the source and drain regions 31, 32 are again diffused as in the conventional CMOS process. The resulting structure is shown in FIG. 5. It is identical to that of FIG. 1 except that the double layer of titanium 4 and amorphous silicon 5 is not present.

Figure 6:
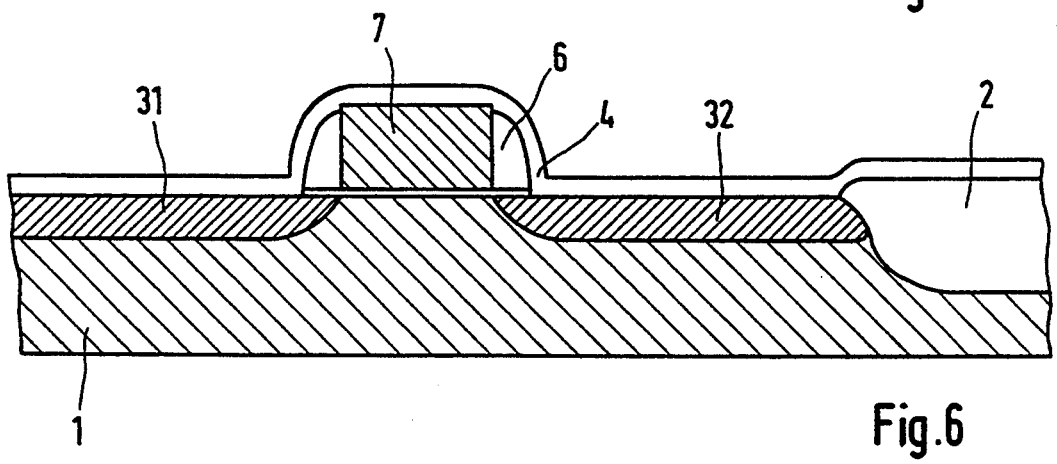
Figure 7:
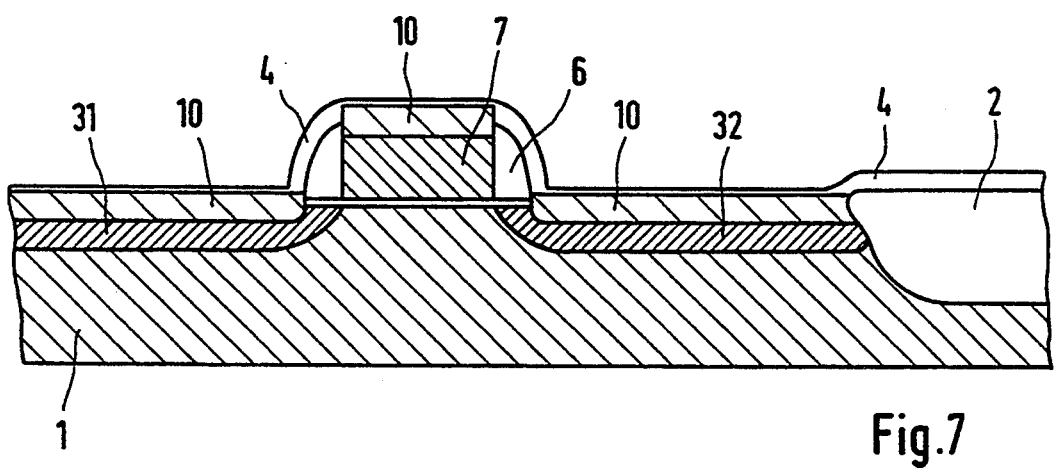
Figure 8:
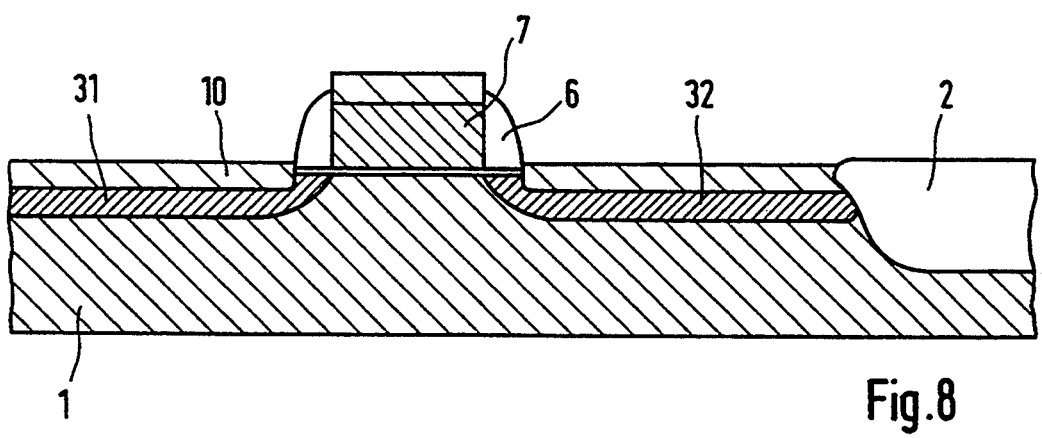

In the next process step, only a titanium layer 4 is sputtered onto the surface (FIG. 6). By annealing at 600°–800° C., titanium silicide (layer 10 in FIG. 7) is then formed in those areas where the metal rests directly on silicon. Next, the unconverted titanium is removed by etching leaving behind the titanium silicide. An etchant such as a solution consisting of $H_2O_2/NH_4O_4/H_2O$ at 1:1:5 will etch the unconverted titanium without etching the titanium silicide. A second annealing step is performed at 800°–1000° C. in order to further reduce the sheet resistivity of the silicide formed (FIG. 8)

Figure 9:
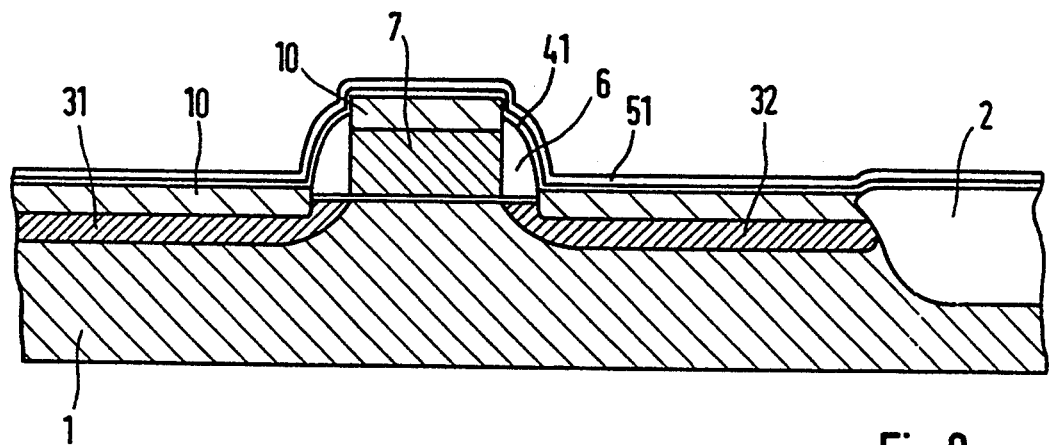
FIGS. 9 to 11 show the formation of the LI silicide.
Figure 10:
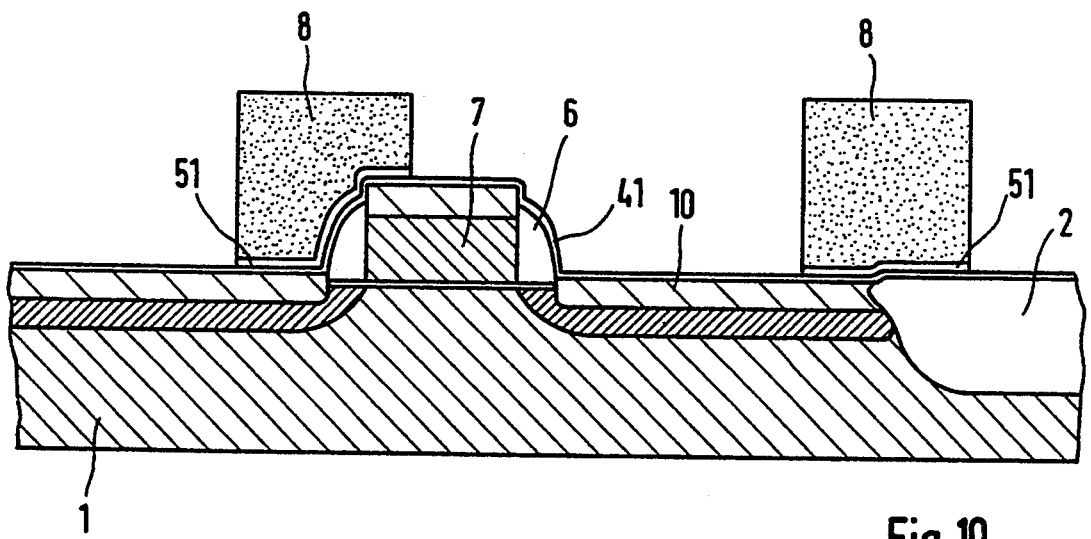

After that, a double layer of titanium 41 and amorphous silicon 51 is sputter-deposited over the entire surface of the component (FIG. 9).

Figure 11:
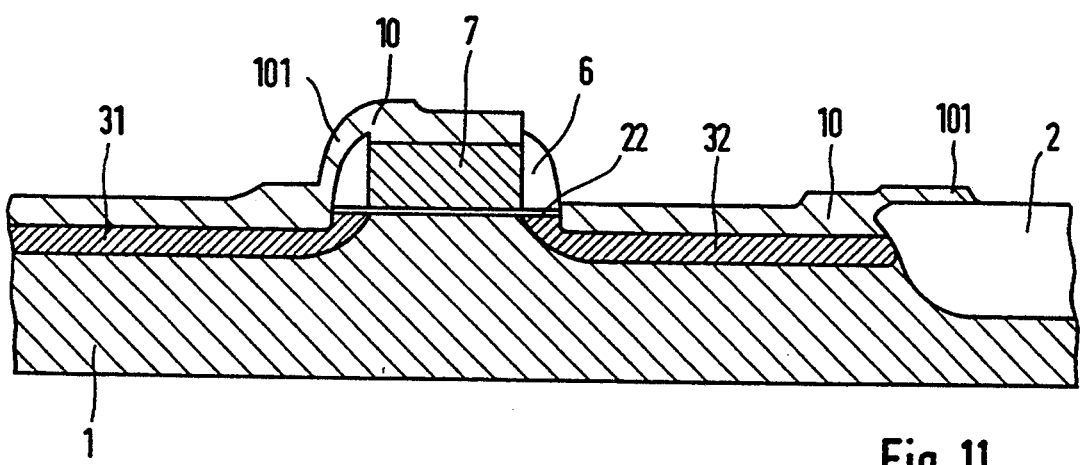

The LI regions are defined by means of a photolithographic process, with the remainder of the etch mask covering those regions where the LIs are to be formed. The alpha silicon layer 51 is etched away, leaving the structure of FIG. 10. Next, the etch mask (photoresist layer 8) is removed, and the structure is annealed at 600°–800° C. to form titanium silicide in the LI regions. The unconverted titanium is removed by etching, and in a second annealing step at 800°–1000° C., the sheet resistivity of the silicide formed is reduced; conversion of C49 silicide to C54 silicide (FIG. 11).

Following these steps, the standard CMOS process is continued.

The method according to the invention has more seeps than the method used so far (the reason for this is the desired isolation between the formation of the source/drain/gate silicide and that of the silicide for the LIs), but this is only an apparent disadvantage, since a number of advantages are obtained in this manner.

Compared with the conventional method, the thicknesses of the metal and alpha silicon layers can be kept considerably thinner, because only the LI regions are formed from them. In this manner, considerably higher reliability is achieved during the fabrication of the devices.

Further advantages are:

Through the separation of the process steps, the low sheet resistivity can be preserved in the SALICIDE process, which is well known in semiconductor technology.

The time for the overetching of the alpha silicon can be extended considerably and is nevertheless uncritical, because the metal outside the LI regions is no longer needed.

Even extreme overetching of the alpha silicon guarantees reliable alpha-silicon removal at steep edges even with an anisotropic process, so that no residues will remain in the gate corners.

The extreme overetching ensures irrespective of the shape of the spacers forming the gate edges that the alpha silicon is completely removed.

The above-mentioned possibility of keeping the double layer of metal and alpha silicon relatively thin allows a shorter etching time, which results in better dimensional accuracy of the structure.

Before the annealing step, the metal layer for the source/drain/gate silicide formation need not undergo any other processes (photolithographic process, photoresist stripping) which may interfere with the silicide formation proper.

The reduced presence of metal, in the present example titanium, avoids the so-called silicon suckout effect in the regions of the local interconnects and the active regions.

Those skilled in the art will appreciate that tungsten, molybdenum and tantalum can be freely substituted for titanium. Still other modifications will be apparent to those skilled in the art, and therefore the invention is not to be limited to the disclosed embodiment except as required by the appended claims.

We claim:

1. A method of fabricating CMOS devices with local interconnects during CMOS processing, characterized by the following steps:
   a) sputtering a layer (4) of heat-resistant metal;
   b) a first annealing step for forming a metal-silicide layer (10);
   c) selective etching of the unconverted metal layer (4);
   d) a second annealing step;
   e) sputtering another layer (41) of heat resistant metal and an overlying layer (51) of amorphous alpha silicon;
   f) a photolithographic process for patterning the silicon layer (51), followed by photoresist stripping, and another first annealing step for forming the metal-silicide layers (101);
   g) etching away the remainder of the metal layer (41); and
   h) another annealing step.

2. A method as claimed in claim 1, characterized in that the heat-resistant metal is titanium, tungsten, molybdenum or tantalum.

3. A method of fabricating CMOS devices with local interconnects during CMOS processing, said method comprising the steps of:
   (a) sputtering a layer (4) of a heat resistant metal on said devices;
   (b) annealing said devices to form a metal silicide layer (10) at portions of said layer of heat resistant metal in contact with silicon
   (c) etching the heat resistant metal;
   (d) sputtering another layer (41) of a heat resistant metal and an overlying layer (51) of amorphous alpha silicon on said devices;
   (e) patterning the overlying layer (51) of amorphous alpha silicon to define those regions in which said local interconnects are to be formed;
   (f) annealing said devices to form metal-silicide local interconnects (101) at those portions of said another layer of heat resistent metal which is in contact with the patterned amorphous alpha silicon; and
   (g) etching away the remaining heat resistent metal.

4. The method of claim 3, further including another annealing step, which another annealing step occurs after step (c) in order to convert at least the metal-silicide formed at step (b) to a crystal structure having a lower resistivity than the metal-silicide originally formed at step (b).

5. The method of claim 3, further including another annealing step following step (g) to convert at least the metal-silicide formed at step (f) to a crystal structure having a lower resistivity than the metal-silicide originally formed at step (f).

6. The method of claim 5, wherein said heat resistent metal is selected from the group consisting of titanium, tungsten, molybdenum and tantalum.

7. The method of claim 6, wherein the metal-silicide originally formed at steps (b) and (f) is a C49 silicide.

8. The method of claim 7, wherein metal-silicide is converted to C54 silicide by said another annealing step.

9. The method of claim 8, wherein at least a portion of said metal-silicide local interconnects overlie field oxide formed in said devices.

10. The method of claim 9, wherein at least a portion of said metal-silicide local interconnects overlie polysilicon gate structures formed in said devices.

* * * * *